United States Patent [19]

Rindlisbacher et al.

[11] Patent Number: 5,274,330
[45] Date of Patent: Dec. 28, 1993

[54] ACTUATING DRIVE FOR A NUCLEAR RESONANCE SPECTROMETER

[75] Inventors: Martin Rindlisbacher; Jürg Berther, both of Zürich, Switzerland

[73] Assignee: Spectrospin AG, Switzerland

[21] Appl. No.: 897,908

[22] Filed: Jun. 12, 1992

[30] Foreign Application Priority Data

Jun. 14, 1991 [DE] Fed. Rep. of Germany ....... 4119674

[51] Int. Cl.⁵ .......................................... G01R 33/20
[52] U.S. Cl. .................................... 324/307; 324/300; 324/318; 324/313
[58] Field of Search ............... 324/300, 301, 318, 322, 324/313; 361/289, 300, 296, 287; 336/69

[56] References Cited

U.S. PATENT DOCUMENTS

| | | | |
|---|---|---|---|
| 4,695,801 | 9/1987 | Arakawa et al. | 324/318 |
| 4,698,595 | 10/1987 | Roschmann | 324/313 |
| 4,783,629 | 11/1989 | Arakawa . | |
| 4,944,501 | 7/1990 | Sireul . | |
| 5,041,788 | 8/1991 | Kontor . | |
| 5,170,789 | 12/1992 | Narayan et al. | 324/318 |

FOREIGN PATENT DOCUMENTS

| | | |
|---|---|---|
| 0164801 | 6/1985 | European Pat. Off. . |
| 3421830 | 6/1984 | Fed. Rep. of Germany . |
| 3639140 | 11/1986 | Fed. Rep. of Germany . |
| 3838252 | 11/1988 | Fed. Rep. of Germany . |
| 2583172 | 6/1985 | France . |

OTHER PUBLICATIONS

Review of Scientific Instruments, vol. 38, Nr. 12, Dec. 1, 1967, New York, US, pp. 1810–1812; Abele et al.: Low Temperature Samples Holder Providing Two Degrees of Ratational Freedom Primary Examiner—Michael J. Tokar
Assistant Examiner—Raymond Y. Mah
Attorney, Agent, or Firm—Walter A. Hackler

[57] ABSTRACT

An actuating drive for controllable adjustment of a plurality of actuators in a nuclear resonance spectrometer is characterized in that the actuating drive has a drive train with a drive shaft (9) that can be driven by an electric drive motor (3) and with a plurality of drive train outputs, for coupling to the actuators, each of which can be individually coupled to the drive shaft by means of a changeover device. This enables the actuators to be adjusted automatically.

17 Claims, 5 Drawing Sheets

ACTUATING DRIVE FOR A NUCLEAR RESONANCE SPECTROMETER

BACKGROUND OF THE INVENTION

The invention relates to an actuating drive that is intended to adjust a plurality of actuators in a nuclear resonance spectrometer. Actuating drives of this kind can be present especially in an NMR sample head for acquiring the nuclear resonance spectra of various nuclear species, and are used therein to tune the frequency and set the impedance matching. For this purpose there are provided in known sample heads, for example in order to set the value of a capacitor for frequency tuning, four slide rods which, depending on their slide position, activate capacitors with different values. The value of the effective capacitance can generally be read from a scale on the rods using the decimal system. A sample head can additionally or exclusively have rotating actuators for tuning and matching. A change in tuning and/or impedance matching is necessary, for example, when the nuclear signal of another nuclear species is to be acquired, when the sample is changed, or when changes in temperature occur.

Processes with which frequencies can be set and impedances matched relatively quickly are known. In one process disclosed by DE-A1-38 38 252, for example, the sample head and a reference impedance are alternately connected to a preamplifier attached to the sample head; by comparing the reading obtained therewith, the discrepancy between the instantaneous complex impedance of the sample head and the reference status indicated by the reference impedance is determined, and the user is thereby informed as to how the tuning and matching elements must be adjusted. Because the device from which the specific mismatch and discrepancy in natural frequency of the sample head can be read is located at a distance from the sample head-specifically, on the operating console of the nuclear resonance spectrometer, while the sample head is located inside the magnet of the nuclear resonance spectrometer-the adjustment process itself is awkward and time-consuming, since the user must often move back and forth between the operating console and sample head. To set the frequency and/or matching, it may also be necessary to manipulate actuators elsewhere on a nuclear resonance spectrometer, for example if settable electrical filter circuits need to be tuned.

SUMMARY OF THE INVENTION

In order to simplify the aforementioned setting procedures, the invention provides for an actuating drive for the said actuators which in simpler cases can be remotely actuated by the user sitting at the operating console, but which also and especially is designed to allow automatic setting and matching by means of a remote control using a computer, which is always present on nuclear resonance spectrometers. In particular, such an automatic frequency setting and matching system makes possible, in conjunction with automatic sample changing devices, unsupervised operation of the nuclear resonance spectrometer, for example during the night or on weekends.

The actuating drive in accordance with the invention is characterized in that, for controllable adjustment of a plurality of actuators in a nuclear resonance spectrometer, the actuating drive has a drive train with a drive shaft that can be driven by an electric drive motor and with a plurality of drive train outputs, for coupling to the actuators, each of which can be individually coupled to the drive shaft by means of a changeover device. One advantage consists in the fact that a motor drive for the actuators is made possible in a simple manner.

By means of suitable electrical activation from outside, the drive motor can be operated for a greater or lesser amount of time, thus driving one of the drive train outputs which at the time is coupled to the drive motor via the changeover device. It is conceivable, given suitable design of the changeover device, to actuate the latter as well by corresponding actuation of the drive motor, or to couple the drive motor, by means of electrically actuated couplings, either to the drive train or to the changeover device. Preferably, however, a further electric motor is provided to actuate the changeover device.

When the changeover device is located in the leakage field of a nuclear resonance spectrometer, or in general of a device whose magnetic field must not be excessively disturbed, it is advantageous to make the adjusting drive from non-magnetic material to the greatest extent possible, for example to produce metal parts using aluminum. The said electric motors contain magnetic material, although with the presence of only two electric motors, experiments have not shown any perceptible disturbance of the magnetic field at the position of a sample being examined inside a nuclear resonance spectrometer, since the influence of these motors on the homogeneity of the magnetic field can easily be compensated for, and because measurements on samples are made only when the motors are stopped. The extensive use of non-magnetic material makes possible, in a simple manner, reliable operation of the actuating drive even in the extremely strong leakage field of high-field magnets for nuclear resonance spectrometers. The operation of the electric motors themselves is not negatively affected by the magnetic field.

One embodiment of the invention provides for the changeover device to have a rotatably mounted wheel whose mount is displaceably guided, and which, depending on the position of its mount, couples a wheel integrally joined to one of the drive train outputs with a wheel integrally coupled to the drive motor. This allows a simple design.

One embodiment of the invention provides for the wheel of the changeover device to be displaceably mounted perpendicular to its axis of rotation. This allows for reliable changeover in a simple manner, since the wheel of the changeover device can rotate as it is displaced.

One embodiment of the invention provides for the wheel of the changeover device to contact the wheels coupled together thereby at the same circumferential region. One advantage of this is that when the drive side is at a standstill, no undesired adjustment of the drive outputs can occur as a result of rolling of the wheel of the changeover device.

One embodiment of the invention provides for a number of wheels corresponding to the number of drive train outputs to be provided, with the wheels being arranged with parallel axes in a row next to one another; and for the wheel of the changeover device to be mounted so it can be displaced linearly, so that it can be individually brought into engagement with the said wheels. One advantage lies in the simple design, and in the fact that this arrangement can be used, without major modifications, for any number of drive train outputs or actuators: only the number of the said wheels needs to be changed, and the length of the displacement travel of the said mount in the changeover device changed accordingly.

In order to allow the wheel of the changeover device to be driven with the changeover device in every possible position, it is possible, in accordance with the invention, for a belt driven by the drive motor, especially a toothed belt, to be provided, with which the said wheel is in rollingcontact when the changeover device is actuated, and with which it continually in engagement. In order to implement the friction clutch described below, the side of the toothed belt facing the wheel, generally its outer side, can be smooth.

Another embodiment of the invention provides for a row of gears, in mutual engagement, to be coupled to the drive motor, each gear being aligned with a wheel associated with a drive train output, with the changeover device connecting each two wheels that align with one another. One advantage consists in the simple design. If necessary, the influence of clearance between gears in engagement with one another can be reduced by coupling the drive motor not directly to the last gear in the row, as in the exemplary embodiment, but to a gear displaced to the center of the row.

One embodiment of the invention provides for the wheel of the changeover device to be designed as a friction wheel. One advantage is the fact that this constitutes a friction clutch which can serve to protect the entire arrangement.

One embodiment of the invention provides for position transducers for the position of the drive train output to be provided. One advantage is the fact that remote-controlled or automatic operation is hereby facilitated. The position transducers can be incremental transducers, but also, advantageously, absolute value transducers, which make it simpler to automatically set a predefined starting position of the drive train.

One embodiment of the invention provides for position transducers for the position of the drive motor and/or the further motor to be provided. One advantage consists in the fact that in interaction with the position transducers for the drive train outputs, play in the device can be detected very precisely from the fact that the drive motor is running while no movement has yet occurred at the drive train output. The effect of play can be thereby be taken into account. Jamming can be detected by the sharp rise in motor power consumption in such a case.

One embodiment of the invention provides for the drive train outputs to be connected to motion transmission elements (preferably orientable in any direction), such as cardan shafts, telescoping shafts, bendable shafts, and/or adjustable-length shafts or cables, the other ends of which can be connected to the actuators being actuated. One advantage consists in the fact that easy coupling to the actuators is possible.

One embodiment of the invention provides for ends of the motion transmission elements to be retained in a coupling device to be fastened to a stationary part. One advantage consists in the fact that coupling is facilitated, and coupling errors can easily be prevented.

One embodiment of the invention provides for a screw drive, to convert a rotary motion of a drive train output into a displacement motion, to be arranged in the coupling device. One advantage consists in the fact that actuators that are designed as slide rods can easily be actuated.

One embodiment of the invention provides for the actuating drive to have an electronic circuit to evaluate control signals arriving from outside. This facilitates remote control and automatic operation. Preferably, the electronic circuit can be designed to output signals concerning the switching status of the actuating drive.

Further features and advantages of the invention are evident from the following description of an exemplary embodiment of the invention with reference to the drawings, which show details essential to the invention, and from the Claims. In embodiments of the invention, the individual features can be implemented each independently, or together in any combination.

DETAILED DESCRIPTION OF THE PREFERRED EMBODIMENT

Only those parts essential to an understanding of the invention are drawn on the Figures, while, for example, the mounts for the various rotating parts are depicted only in individual cases.

Figure 1:
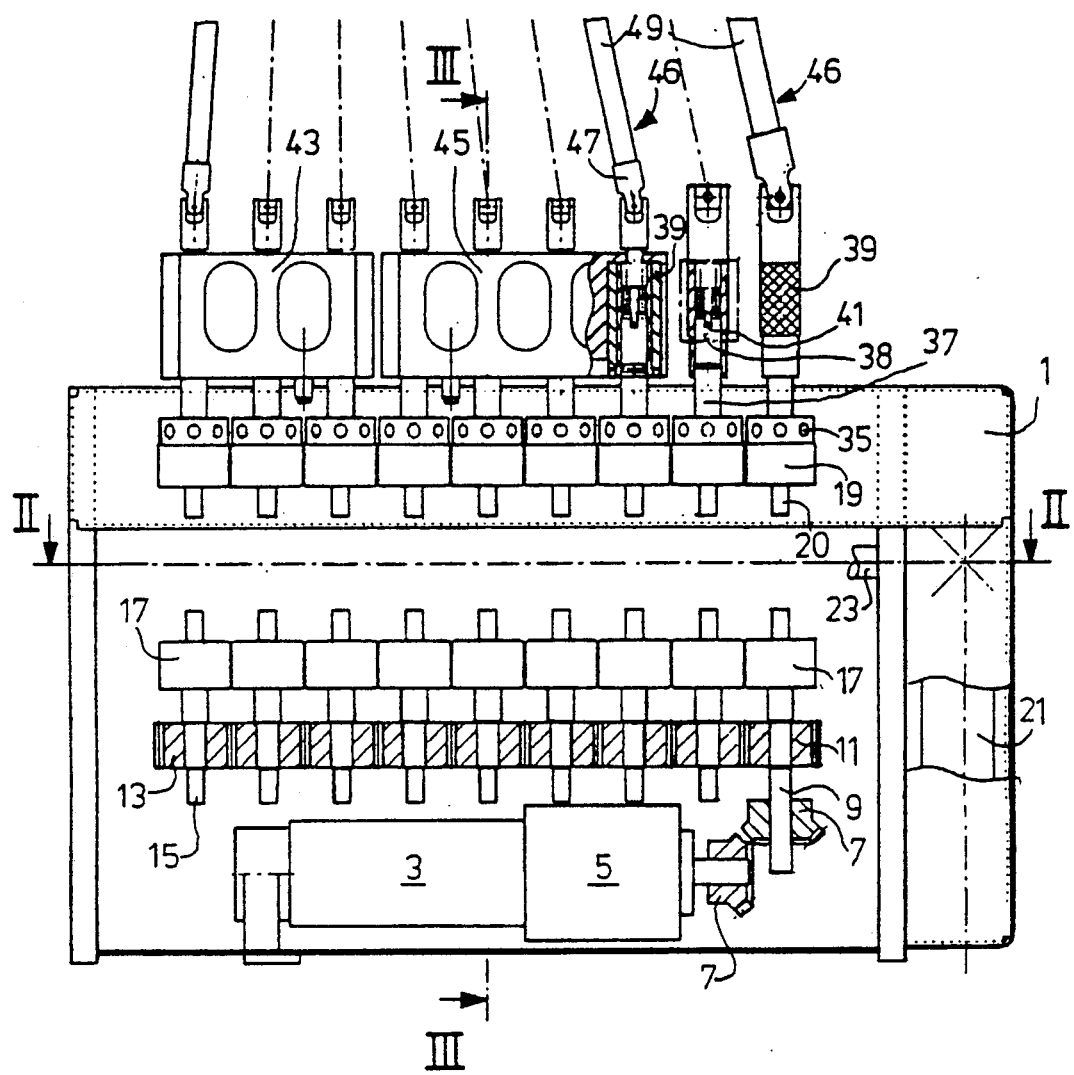
FIG. 1 shows a front view, truncated at the top, of an actuating drive, with many parts being shown in a section along line I—I in FIG. 3, and the parts shown in FIG. 2 omitted for simplicity's sake.

In FIG. 1, in a housing 1 an electric drive motor 3, downstream from which is a stepdown drive train 5 with a stepdown ratio of 30:1, is connected via bevel wheels 7 to a shaft 9 on which sits a gear 11. A further eight identical gears 13 are provided, which are arranged with parallel axes that all lie in a single plane parallel to the plane of FIG. 1 and are in engagement with one another. Thus when the gear 11 rotates, the gear 13 directly engaged with it rotates in the opposite direction, the next gear 13 in the same direction of rotation as gear 11, and so forth. The gears 13 also each sit on a shaft 15 that is rotatably mounted in the housing 1, and on the side of each of the gears 11 and 13 facing away from the drive motor 3 there is arranged non-rotatably, on their shaft 15, one friction wheel 17 made of metal, with the diameter of the friction wheels 17 being slightly less than the distance from center to center of the individual gears 11 and 13. The friction wheels 17 are all of the same size.

Figure 2:
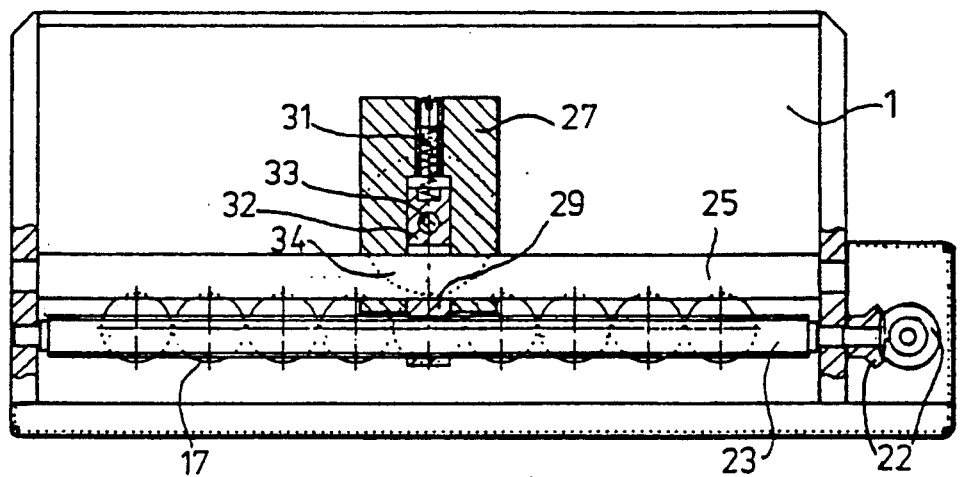
FIG. 2 shows a section along line II—II in FIG. 1.

Nine further friction wheels 19 are rotatably mounted on shafts 20 in the housing 1 on the same axis as the shafts of the gears 11 and 13; the diameter of these friction wheels is identical to that of the friction wheels 17. The design is such that when the drive motor 3 is running, as a result of which all the friction wheels 17 are caused to rotate, exactly one of the further friction wheels 19 can be driven, depending on the switching position of a changeover device. This changeover device has an electric motor 21 which drives a threaded spindle 23 (depicted only in truncated form in FIG. 1, and also shown in FIG. 2) via bevel wheels 22. The long axis of the motor 21 runs at right angles to the long axis of the drive motor 3. Running parallel to the threaded spindle 23 is a guide rod 25 on which is displaceably guided a slide element 27 that has a nut 29 into which the threaded spindle 23 engages. When the threaded spindle 23 is rotated by the motor 21, the slide element 27 is therefore displaced. Rotatably mounted in the slide element 27, in a pillow block 32 braced by compression springs 31 that is displaceably guided in the slide element 27 at right angles to the long axis of the threaded spindle 23, is a shaft 33, on the two ends of which are non-rotatably fastened friction wheels 34 of identical size, which are thus non-rotatably joined to one another by the shaft 33. These friction wheels 34 are made of a plastic that, in interaction with the metal of the friction wheels 17 and 19, has a sufficiently high coefficient of friction. The distance between the two friction wheels 34 is such, and they are arranged in such a way, that one of the friction wheels 34 is engaged with one of the friction wheels 17, and the other of the friction wheels 34 with one of the friction wheels 19. The compression springs 31 provide a sufficiently firm contact between the individual friction wheels so that reliable transmission of motion is possible, but without causing damage in the event of jamming of parts; instead, in the latter case, the slip clutch constituted by the friction wheels simply slips.

On their region lying outside the region of the friction wheels 34, the friction wheels 19 carry, distributed over their circumference, a series of reflectors 35, which together with a light transmitter and light receiver 36 constitute a reflective photoelectric barrier with which, by means of an electronic circuit, the rotation angle covered by the respective friction wheel 19, and its position, can be determined. Similar reflective photoelectric barriers or general rotation angle sensors and/or rotary position sensors are also provided on the drive motor and on the motor driving the switching device.

Figure 3:
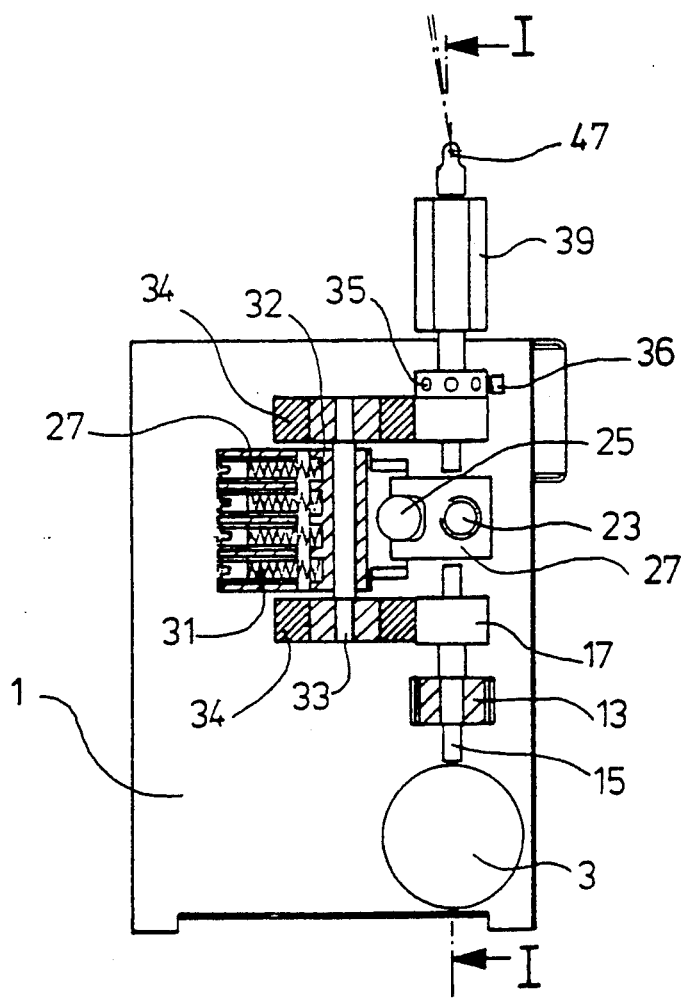
FIG. 3 shows a depiction that is essentially a section along line III—III in FIG. 1.

The shafts 20 projecting upward out of the housing 1 in FIGS. 1 and 3 are designed for non-rotating attachment to mechanical coupling elements, called insertion shafts 39. For this purpose, the ends 37 of the shafts 20 have at their upper end a diagonal groove 38 like a screwdriver slot of a standard screw, into which a part 41, resembling the blade of a screwdriver, of an insertion shaft 39 can engage. This makes possible an easily detached non-rotating connection; because positions that match one another differ from one another in each case by a rotation angle of 180 degrees, a slight amount of play in the entire arrangement does not prevent insertion in a desired predefined position. It is evident in FIG. 1 that the three leftmost insertion shafts are connected and retained parallel to and at a distance from one another by a connecting part 43, and the next four insertion shafts by a connecting part 45, so that they can be slid onto the free ends 37 of the shafts 20. Assembly and disassembly can thus proceed quickly, and the risk of confusion is also prevented. In the example, the two insertion shafts on the right are each inserted individually.

Figure 4:
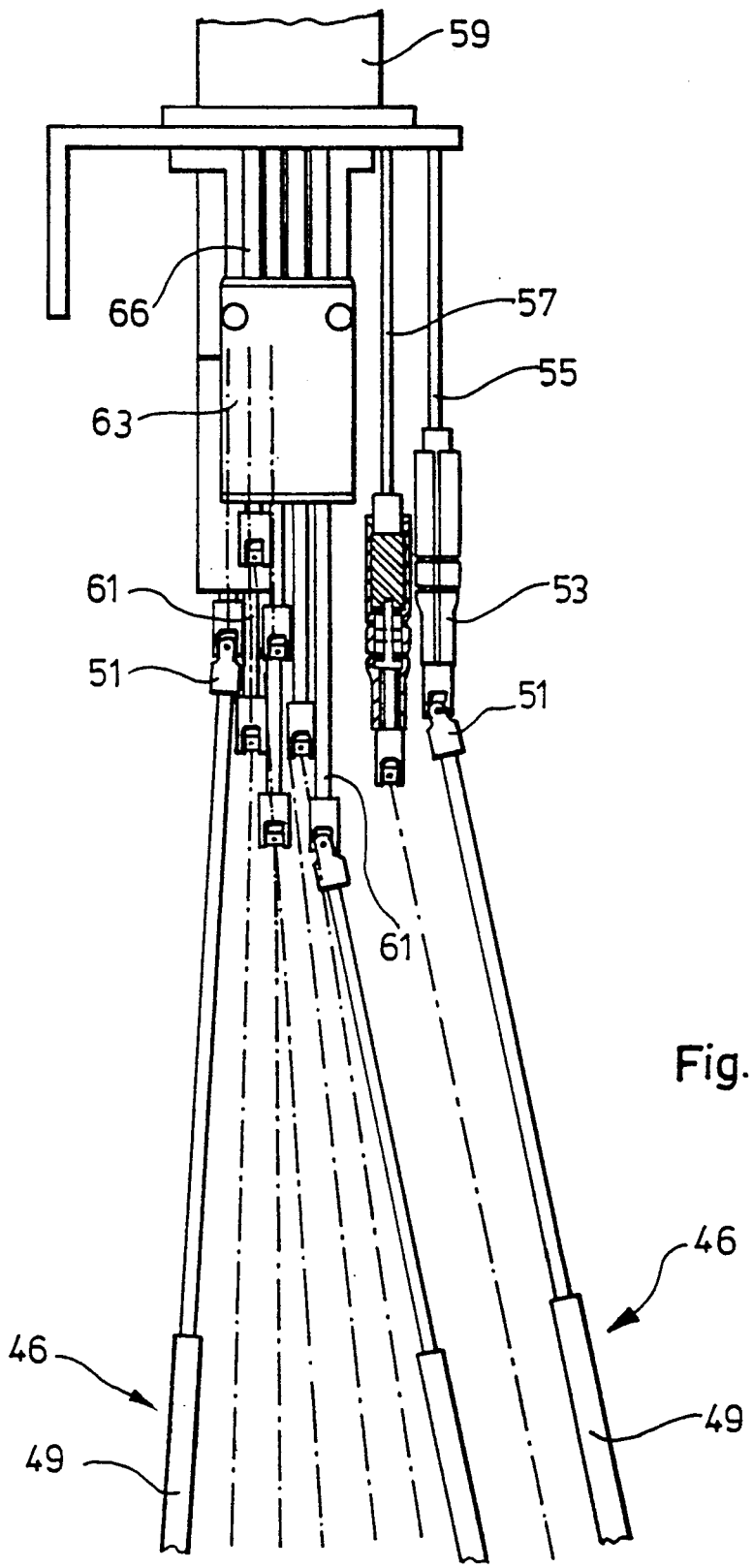
FIG. 4 shows the upward continuation of FIG. 1, as truncated at the top.
Figure 5:
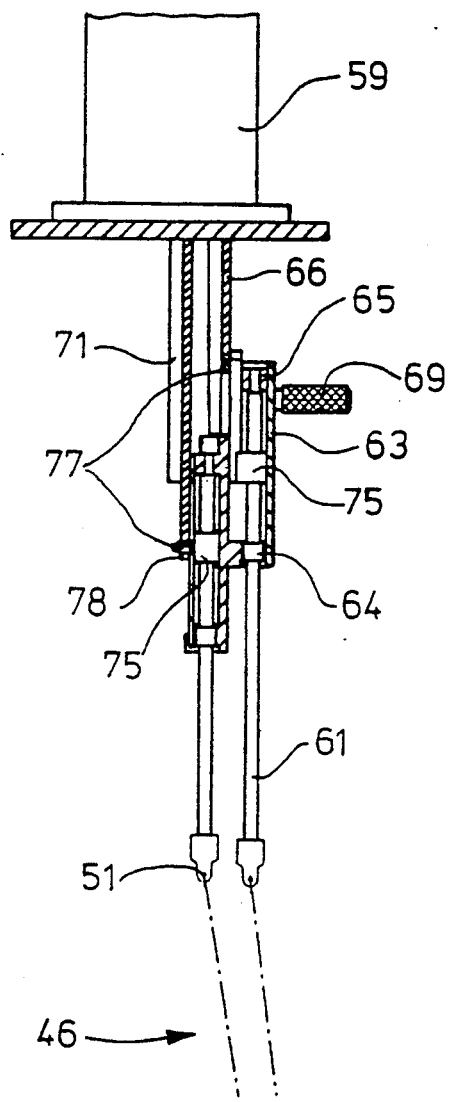
FIG. 5 shows a detail of FIG. 4 in a section running at right angles to the plane of FIG. 4.

Each insertion shaft 39 is part of a cardan shaft 46, which consists of the respective insertion shaft 39; a shaft 49 that can be pulled out, is connected to the said insertion shaft by a first universal joint 47, and transfers rotary motions and can thus be made, for example, of rectangular profiled sections displaceably guided within one another; and a second universal joint (see FIGS. 4 and 5).

In the case of the two cardan shafts 46 on the right in FIGS. 1 and 4, there is connected to the second universal joint 51 a further insertion shaft 53, which in operation preferably runs parallel to the associated insertion shaft 39, so that a rotary motion of the associated friction wheel 19 is uniformly transferred to the further insertion shaft 53. The further insertion shafts 53 associated with the two cardan shafts on the right in FIG. 1 in turn create, like the insertion shafts 39, a non-rotating and detachable connection to two rods 55 and 57 which can rotate about their long axes and are rotatable actuators of a sample head 59.

The seven cardan shafts on the left in FIGS. 1 and 4 rotatably drive, via the second universal joints 51, rods 61 that in this example are, however, not actuators of the sample head; instead the rotary motion of these rods 61 is converted, by a slide drive arrangement 63, into a displacement motion, by means of which the aforesaid slide rods 66, which are the further actuators of the sample head 59 used here, are displaced. For this purpose, the rod 61 connected to the second universal joint 51 in its upward extension is configured, approximately in the region of its upper half, as a threaded spindle that is rotatably mounted in a stationary bearing 64, 65. The stationary bearing is formed by the fact that the slide drive arrangement 63 in which the bearings 64 and 65 are provided is attached by means of fastening screws 69 to a stationary part of the sample head, namely to the so-called grid housing 71, which also serves as guide for the slide rods 66. On the threaded portion of each rod 61 slides a nut 75, guided in a non-rotating but displaceable manner in a housing of the slide drive arrangement 63, which has a mandrel-like extension 77 that engages in a hole 78, present on the known sample heads in the slide rod, which was originally designed for insertion of a manually actuated hook. The extension 77 is thus displaced upward or downward depending on the direction of rotation of the rod 61, and displaces the slide rod in the same direction.

Since the rods 61 are also connected to the slide drive arrangement 63 when the latter is decoupled from the sample head 59, during rotation one of the rods 61 must displace the corresponding nut 75 in the slide drive arrangement 63. It is therefore possible, even in the decoupled state, to bring the extensions 77 into a predefined starting position by suitable actuation of the two motors of the actuating drive, additionally to bring the slide rods of the sample head manually into a starting position appropriate thereto, and then to couple the actuating drive easily to the slide rods. It is advantageous if the actuating drive can be brought into the said starting position by means of a switch actually arranged on it, for example a pushbutton, in order to accelerate the coupling process. If decoupling occurs in this starting position, the slide rods of the sample head are then, at the moment the actuating drive is disengaged, already in the position that they need to occupy when next used with the actuating drive.

Figure 6:
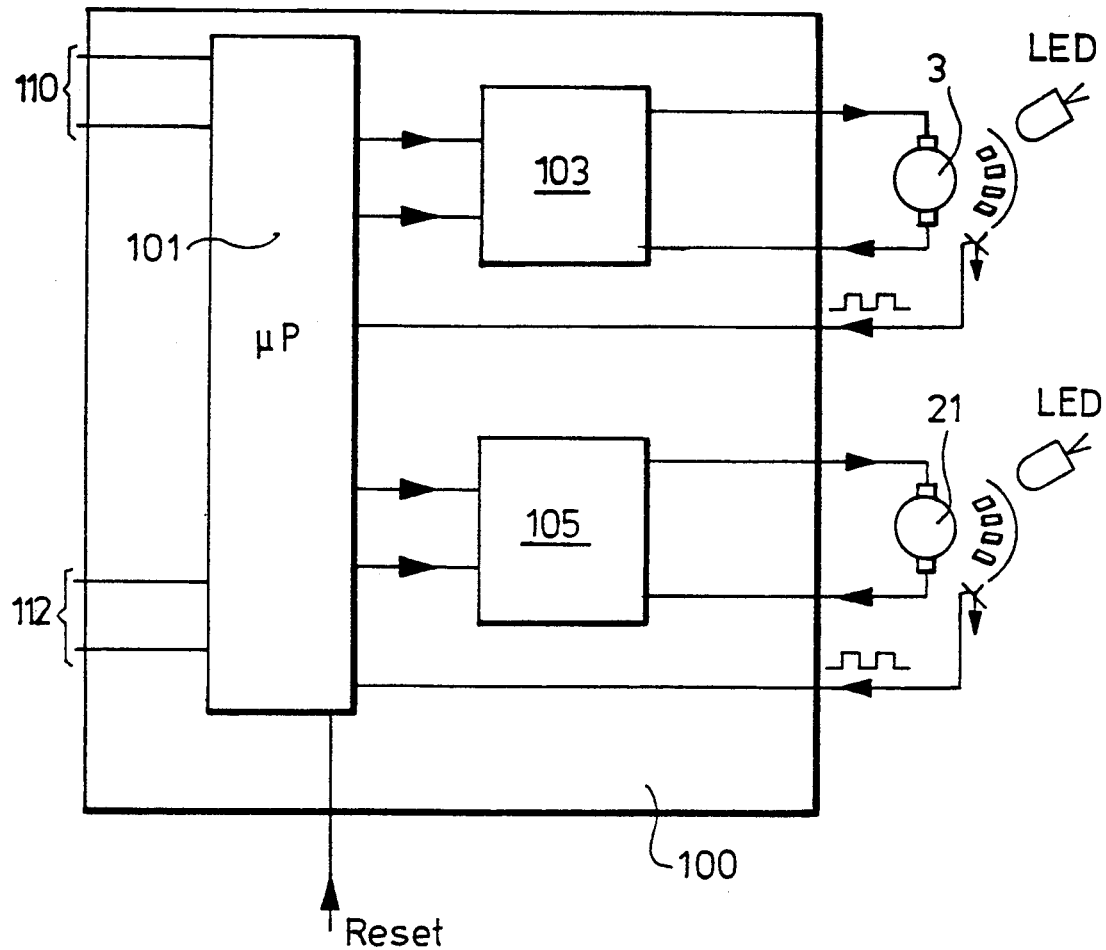
FIG. 6 shows the block diagram of an electronic circuit.

The electronic circuit 100 for the actuating drive, shown only schematically in FIG. 6, has a commercial integrated microprocessor for controlling small motors; this is the $\mu P$ 78310 microprocessor made by NEC of Japan. Connected to outputs of this integrated circuit 101 are two power stages 103 and 105, of which the former controls the drive motor 3 and the latter the further motor 21. These two motors are equipped with reflective photoelectric barriers, the signals of which are also conveyed to the integrated circuit 101. Certain inputs 110 of the integrated circuit 101 are provided for the input of analog input signals, while further connections 112 form an ordinary serial channel for the input and output of data.

The aforesaid starting position of the actuating drive and a sample head is used, as mentioned, to couple together and separate these parts. When a sample head is changed or when the nuclear resonance frequency to be acquired is changed, the way in which the actuators need to be set is normally known quite precisely, so that subsequently only fine correction is required when the complex impedance of the sample head is measured. Thus the actuating drive is initially set automatically to the settings known to the nuclear resonance spectrometer computer, which can occur very quickly. Fine correction then also requires little time.

To allow the computer to monitor the activity of the actuating drive, the electronic circuit 100 outputs the following data: changeover device setting; number of rotation steps executed by the motors to the left and right; forced shutdown of a motor due to a malfunction (jamming) or because an end stop was reached; position of the individual drive train outputs; arrival of the actuating drive at the starting position necessary for coupling and decoupling.

The computer conveys the following information to the actuating drive: couple a specific drive train output to the drive motor; rotate the drive motor to the left or right for a specific number of steps; return to starting position (i.e. perform a reset procedure).

If jamming of a motor due to a malfunction is detected, the electronic circuit first attempts to reverse the motors polarity so that it rotates in the opposite direction, and then tries again to perform the originally intended setting procedure.

Every part of the actuating drive, with the exception of the motors and the friction wheels 37, which are made of plastic, is made of non-metallic metal, specifically aluminum.

In the example, the motors have an operating voltage of 24 volts; the maximum operating current of the drive motor is 0.8 A, and that of the changeover device motor is 0.2 A, at maximum.

The sample head can, for example, be a model Z 3149 of Spectrospin AG, CH-8117, Fällanden, Switzerland, which is suitable for the spectra of the following nuclear species: 1H, 31P, 37Rb, 13C, 2H, 17O, 15N, 14N, 97Mo, and 109Ag.

In the example, the starting position corresponds to the zero position for all slide rods. No starting position is provided for the rotatable actuators.

It is also important for the invention that the actuating drive can easily be used for existing sample heads and that the coupling process is simple. A single actuating drive can be used with a plurality of different sample heads.

The reference numerals in the Claims are not restrictive, but are intended to facilitate understanding.

We claim:

1. Actuating drive for controlling adjustment of a plurality of actuators in a nuclear resonance spectrometer, the actuating drive comprising:
    a drive train including a drive motor coupled to a drive shaft and a plurality of drive train output wheel means for coupling to a plurality of wheels driving the plurality of actuators, the wheels driving the actuators being arranged with parallel axes in a row next to one another; and
    changeover means for selectively and individually coupling each of said plurality of the actuator driving wheels to said plurality of output wheel means, said changeover means including a rotatably mounted wheel and means, mounting the rotatably mounted wheel, for linear displacement of the rotatably mounted wheel in order to enable engagement of the rotatably mounted wheel with both one of the plurality of drive train output wheels means and one of the plurality of the actuator driving wheels.

2. Actuating drive according to claim 1 further comprising electric motor means for actuating the changeover means.

3. Actuating drive according to claim 1, wherein the rotatably mounted wheel of the changeover means is mounted for displacement perpendicular to its axis of rotation.

4. Actuating drive according to claim 1, wherein the rotatably mounted wheel of the changeover means contacts the drive train output wheel means and the actuator driving wheels in a same circumferential region.

5. Actuating drive according to claim 1, wherein the drive train further comprises a row of gears, in mutual engagement, coupled to the drive motor.

6. Actuating drive according to claim 1, wherein the rotatably mounted wheel of the changeover means is a friction wheel.

7. Actuating drive according to claim 1, further comprising position transducer means for determining a position of the drive train output means.

8. Actuating drive according to claim 2, further comprising position transducer means for determining a position of at least one of the drive motor and the electric motor means.

9. Actuating drive according to claim 1, further comprising motion transmission elements, between the drive train output means and the actuators being actuated.

10. Actuating drive according to claim 9, wherein the motion transmission elements are selected from the group of cardan shafts, telescoping shafts, bendable shafts and adjustable-length shafts and cables.

11. Actuating drive according to claim 9, wherein ends of the motion transmission elements are retained in a coupling device adapted for fastening to a stationary part.

12. Actuating drive according to claim 11, further comprising screw drive, means for converting a rotary motion of a drive train output into a displacement motion, said screw drive means being disposed in the coupling device.

13. Actuating drive according to claim 9, wherein ends of a plurality of the motion transmission elements are retained in a predetermined position relative one to the other by an interconnecting element in a manner enabling the motion transmission elements to be rapidly connected to other elements.

14. Actuating drive according to claim 1, wherein the drive train is comprised of substantially all non-magnetic materials.

15. Actuating drive according to claim 1, wherein the actuating drive further comprises electronic circuit, means for evaluating control signals arriving from outside the actuating drive.

16. Actuating drive according to claim 15 wherein the electronic circuit means is designed to output signals concerning the switching status of the actuating drive.

17. Actuating drive according to claim 1, further comprising electric motor means for actuating the changeover means, the rotatably mounted wheel of the changeover device contacts the drive train output wheel means and the actuator driving wheels in a same circumferential region and the rotatably mounted wheel of the changeover means is designed as a friction wheel, said actuating drive further comprises position transducers for providing the position of the drive train output, position transducers for providing the position of at least one of drive motor and electric motor means, the drive train output means are connected to motion transmission elements, other ends of which being connected to the actuators being actuated, the motion transmission elements are selected from the group of cardan shafts, telescoping shafts, bendable shafts and adjustable-length shafts and cables, ends of the motion transmission elements are retained in a coupling device to be fastened to a stationary part, screw drive means for converting a rotary motion of a drive train output means into a displacement motion, is arranged in the coupling device means, ends of a plurality of motion transmission elements are retained in a predetermined position relative one to the other by an interconnecting element, for enabling them to be rapidly connected to other elements, the drive consists largely of non-magnetic materials, the actuating drive has an electronic circuit to evaluate control signals arriving from outside, and the electronic circuit is designed to output signals concerning the switching status of the actuating drive.

* * * * *